United States Patent
Coffey et al.

(10) Patent No.: US 8,451,590 B2
(45) Date of Patent: May 28, 2013

(54) MODULAR POWER DISTRIBUTION SYSTEM AND METHODS

(75) Inventors: Joseph C. Coffey, Burnsville, MN (US); Bradley Blichfeldt, Savage, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 126 days.

(21) Appl. No.: 13/193,246

(22) Filed: Jul. 28, 2011

(65) Prior Publication Data

US 2011/0286154 A1 Nov. 24, 2011

Related U.S. Application Data

(63) Continuation of application No. 12/490,911, filed on Jun. 24, 2009, now Pat. No. 7,995,329, which is a continuation of application No. 11/654,367, filed on Jan. 17, 2007, now Pat. No. 7,554,796.

(60) Provisional application No. 60/760,598, filed on Jan. 20, 2006, provisional application No. 60/762,915, filed on Jan. 27, 2006.

(51) Int. Cl.
*H02B 1/04* (2006.01)
*G01F 1/26* (2006.01)

(52) U.S. Cl.
USPC ............ 361/643; 361/18; 361/632; 307/42; 307/43; 307/71; 713/340; 323/223

(58) Field of Classification Search
USPC ............ 361/18, 31, 94, 96, 93.1–93.4, 87, 361/97, 72, 114, 115, 103, 154, 601, 608–624, 361/642–648, 724–727, 823; 307/10.1, 11, 307/29, 31, 38, 42, 43, 52, 64, 70, 71, 112, 113, 147, 360, 125, 115, 86, 18, 25; 323/223, 323/272; 174/50, 59, 48; 713/310, 340; 439/55, 439/65

See application file for complete search history.

(56) References Cited

U.S. PATENT DOCUMENTS 3,590,325 A 6/1971 McMillen et al.
3,846,676 A 11/1974 Ryczek et al.
(Continued)

FOREIGN PATENT DOCUMENTS

CH 300420 10/1954
DE 36 28 130 C1 11/1987
(Continued)

OTHER PUBLICATIONS

Hendry Telephone Products document, 2 pages, entitled "Power Distribution, Flexible Series," dated Feb. 1998, pp. 6 and 7.
(Continued)

*Primary Examiner* — Michail V Datskovskiy
(74) *Attorney, Agent, or Firm* — Merchant & Gould P.C.

(57) ABSTRACT

A modular power distribution system comprises a chassis; and a backplane including a power input, and a plurality of module connection locations. A plurality of modules are mounted in the chassis, each module mounted to one of the module connection locations. Each module includes: (i) an OR-ing diode; (ii) a circuit protection device; (iii) a microprocessor controlling the circuit protection device; and (iv) a power output connection location. A circuit option switch is located on each module for setting the current limits for each module. A control module is provided connected to the backplane.

17 Claims, 4 Drawing Sheets

U.S. PATENT DOCUMENTS

| | | | |
|---|---|---|---|
| 4,271,447 | A | 6/1981 | Howell |
| 4,333,122 | A | 6/1982 | Hayden et al. |
| 4,597,025 | A | 6/1986 | Rutchik et al. |
| 4,652,769 | A | 3/1987 | Smith et al. |
| 4,663,539 | A | 5/1987 | Sharp et al. |
| 4,675,538 | A | 6/1987 | Epstein |
| 4,689,712 | A | 8/1987 | Demeyer |
| 4,844,458 | A | 7/1989 | Gatchel et al. |
| 5,068,778 | A | 11/1991 | Kosem et al. |
| 5,079,686 | A | 1/1992 | Vinciarelli |
| 5,122,726 | A | 6/1992 | Elliott et al. |
| 5,170,310 | A | 12/1992 | Studtmann et al. |
| 5,204,800 | A | 4/1993 | Wasney |
| 5,214,560 | A | 5/1993 | Jensen |
| 5,274,767 | A | 12/1993 | Maskovyak |
| 5,311,392 | A | 5/1994 | Kinney et al. |
| 5,335,135 | A | 8/1994 | Kinney |
| 5,357,394 | A | 10/1994 | Piney |
| 5,375,032 | A | 12/1994 | Hatakeyama et al. |
| 5,466,974 | A | 11/1995 | Sutrina et al. |
| 5,485,343 | A | 1/1996 | Santos et al. |
| 5,488,338 | A | 1/1996 | Seymour et al. |
| 5,500,781 | A | 3/1996 | Santos et al. |
| 5,539,605 | A | 7/1996 | Pollman et al. |
| 5,615,105 | A | 3/1997 | Tofigh et al. |
| 5,623,173 | A | 4/1997 | Fasullo et al. |
| 5,640,061 | A | 6/1997 | Bornhorst et al. |
| 5,675,480 | A | 10/1997 | Stanford |
| 5,682,287 | A | 10/1997 | Pollman et al. |
| 5,712,779 | A | 1/1998 | Sheppard et al. |
| 5,726,506 | A | 3/1998 | Wood |
| 5,740,027 | A | 4/1998 | Akers et al. |
| 5,745,670 | A | 4/1998 | Linde |
| 5,747,972 | A | 5/1998 | Baretich et al. |
| 5,752,047 | A | 5/1998 | Darty et al. |
| 5,754,386 | A | 5/1998 | Barbour et al. |
| 5,875,087 | A | 2/1999 | Spencer et al. |
| 5,940,288 | A | 8/1999 | Kociecki |
| 5,943,204 | A | 8/1999 | Jones et al. |
| 5,969,965 | A | 10/1999 | Byrne et al. |
| 5,973,409 | A | 10/1999 | Neibecker et al. |
| 5,973,416 | A | 10/1999 | Guenther |
| 6,014,322 | A | 1/2000 | Higashi et al. |
| 6,038,126 | A | 3/2000 | Weng |
| 6,055,149 | A | 4/2000 | Gillberg et al. |
| 6,067,023 | A | 5/2000 | Bendikas |
| 6,084,758 | A | 7/2000 | Clarey et al. |
| 6,127,882 | A | 10/2000 | Vargha et al. |
| 6,150,734 | A | 11/2000 | Neibecker et al. |
| 6,160,699 | A | 12/2000 | Gibson et al. |
| 6,201,721 | B1 | 3/2001 | Suranyi et al. |
| 6,222,714 | B1 | 4/2001 | Hoffman |
| 6,222,716 | B1 | 4/2001 | Chiang et al. |
| 6,229,288 | B1 | 5/2001 | Baretich et al. |
| 6,240,478 | B1 | 5/2001 | Brickell |
| 6,249,411 | B1 | 6/2001 | Hemena et al. |
| 6,252,365 | B1 | 6/2001 | Morris et al. |
| 6,262,872 | B1 | 7/2001 | Messerli et al. |
| 6,301,133 | B1 | 10/2001 | Cuadra et al. |
| 6,304,462 | B1 | 10/2001 | Balakrishnan et al. |
| 6,317,012 | B1 | 11/2001 | Coffey |
| 6,330,142 | B1 | 12/2001 | Bellotto et al. |
| 6,331,933 | B1 | 12/2001 | Rumney |
| 6,356,426 | B1 | 3/2002 | Dougherty |
| 6,366,062 | B2 | 4/2002 | Baretich et al. |
| 6,420,906 | B1 * | 7/2002 | Kohda ............... 326/114 |
| 6,421,215 | B1 | 7/2002 | Bushue |
| 6,452,790 | B1 | 9/2002 | Chu et al. |
| 6,456,203 | B1 | 9/2002 | Schomaker et al. |
| 6,462,926 | B1 | 10/2002 | Zaretsky et al. |
| 6,489,748 | B1 | 12/2002 | Okamura |
| 6,611,411 | B2 | 8/2003 | Williams et al. |
| 6,661,119 | B2 | 12/2003 | Liu et al. |
| 6,719,149 | B2 | 4/2004 | Tomino |
| 6,731,487 | B2 | 5/2004 | Fletcher et al. |
| 6,731,523 | B2 | 5/2004 | Jitaru |
| 6,735,704 | B1 | 5/2004 | Butka et al. |
| 6,788,512 | B2 | 9/2004 | Vicente et al. |
| 6,800,962 | B2 * | 10/2004 | Bahl et al. ............... 307/52 |
| 6,815,843 | B1 | 11/2004 | Kageyama |
| 6,856,045 | B1 | 2/2005 | Beneditz et al. |
| 6,873,510 | B2 | 3/2005 | Schomaker et al. |
| 6,876,102 | B2 | 4/2005 | Alappat |
| 6,891,425 | B1 | 5/2005 | Huynh |
| 6,892,115 | B2 | 5/2005 | Berkcan et al. |
| 6,907,331 | B2 | 6/2005 | Paquet |
| 6,937,461 | B1 | 8/2005 | Donahue, IV |
| 6,947,287 | B1 | 9/2005 | Zansky et al. |
| 6,995,964 | B2 | 2/2006 | Plemmons et al. |
| 6,999,291 | B2 | 2/2006 | Andarawis et al. |
| 7,005,996 | B2 | 2/2006 | Cabrera et al. |
| 7,007,179 | B2 | 2/2006 | Mares et al. |
| 7,020,790 | B2 | 3/2006 | Mares |
| 7,038,433 | B2 | 5/2006 | Fan et al. |
| 7,043,543 | B2 | 5/2006 | Ewing et al. |
| 7,058,482 | B2 | 6/2006 | Fletcher et al. |
| 7,102,334 | B2 | 9/2006 | Wiegand et al. |
| 7,126,803 | B2 | 10/2006 | Schomaker et al. |
| 7,162,653 | B2 | 1/2007 | Mares et al. |
| 7,171,461 | B2 | 1/2007 | Ewing et al. |
| 7,203,849 | B2 | 4/2007 | Dove |
| 7,212,049 | B2 | 5/2007 | Oka |
| 7,230,813 | B1 | 6/2007 | Canova et al. |
| 7,272,023 | B2 | 9/2007 | Schlecht |
| 7,276,813 | B2 | 10/2007 | Dobbs et al. |
| 7,301,742 | B2 | 11/2007 | Tignor et al. |
| 7,304,828 | B1 | 12/2007 | Shvartsman |
| 7,315,151 | B2 | 1/2008 | Thompson et al. |
| 7,355,301 | B2 | 4/2008 | Ockert et al. |
| 7,365,964 | B2 | 4/2008 | Donahue, IV |
| 7,393,248 | B2 * | 7/2008 | Best et al. ............... 439/638 |
| 7,466,573 | B2 | 12/2008 | Kojori et al. |
| 7,525,782 | B1 | 4/2009 | Hedrick et al. |
| 7,532,955 | B2 | 5/2009 | Dougherty |
| 7,554,796 | B2 | 6/2009 | Coffey et al. |
| 7,671,490 | B2 * | 3/2010 | Hartung et al. ............... 307/115 |
| 7,747,879 | B2 | 6/2010 | Tofigh et al. |
| 7,851,945 | B2 * | 12/2010 | Williams et al. ............... 307/86 |
| 7,999,410 | B2 * | 8/2011 | Hartung et al. ............... 307/28 |
| 2002/0020682 | A1 | 2/2002 | Broome |
| 2002/0085399 | A1 * | 7/2002 | Brooks et al. ............... 363/65 |
| 2002/0109972 | A1 | 8/2002 | Mallette |
| 2002/0125865 | A1 | 9/2002 | Buchanan |
| 2002/0181249 | A1 | 12/2002 | Coffey |
| 2003/0112647 | A1 * | 6/2003 | Liu et al. ............... 363/144 |
| 2004/0017642 | A1 | 1/2004 | Alappat |
| 2004/0113804 | A1 | 6/2004 | Cabrera et al. |
| 2005/0226013 | A1 | 10/2005 | Fontana |
| 2006/0044709 | A1 | 3/2006 | Seiersen |
| 2006/0046766 | A1 | 3/2006 | Hair, III et al. |
| 2006/0071559 | A1 | 4/2006 | Hanson et al. |

FOREIGN PATENT DOCUMENTS

| | | |
|---|---|---|
| EP | 1 517 523 A1 | 3/2005 |
| GB | 2 018 031 A | 10/1979 |
| WO | WO 01/72098 A2 | 9/2001 |
| WO | WO 01/76030 A2 | 10/2001 |

OTHER PUBLICATIONS

Hendry Telephone Products document, 2 pages, entitled "Power Distribution, High Density," dated Feb. 1998, pp. 9 and 10.

Hendry Telephone Products document, 2 pages, entitled "Power Distribution, Intelligent," dated Feb. 1998, pp. 17 and 18.

Hendry Telephone Products document, 2 pages, entitled "Power Distribution, Traditional," dated Feb. 1998, pp. 23 and 24.

Telect.com catalog page entitled "Uninterrupted Battery Fuse Panel,", copyright 1999, p. 7.

Telect.com catalog page entitled "Intermediate Fuse Panels," copyright 1999, p. 8.

Telect.com catalog, 2 pages entitled "Circuit Breaker Panel," copyright 1999, pp. 9 and 10.

Telect.com catalog, 2 pages entitled "High Current Circuit Breaker Panel," copyright 1999, pp. 11 and 12.

Telect.com brochure, 2 pages, entitled "Two Fuse Panels in One Rack Space—Intermediate Fuse Panel," dated Jul. 1998.
Printouts from www.telect.com dated Mar. 22, 2000, entitled "Telect, Fuse Panels", 2 pages.
Printouts from www.telect.com dated Mar. 22, 2000, entitled "Telect's Traditional Fuse Panels," 3 pages.
Printouts from www.telect.com dated Mar. 22, 2000, entitled "Telect's Total Front Access Fuse Panels," 2 pages.
Printouts from www.telect.com dated Mar. 22, 2000, entitled "Telect's Intermediate Fuse Panels," 2 pages.
Printouts from www.telect.com dated Mar. 22, 2000, entitled "Telect, Configurable Circuit Breaker Panel," 2 pages.
Printouts from www.telect.com dated Mar. 22, 2000, entitled "Telect's Circuit Breaker Panel," 2 pages.
Printouts from www.telect.com dated Mar. 30, 2000, entitled "Telect's Uninterrupted Battery Fuse Panel," 4 pages.
ADC Telecommunications, Inc., PowerWorx™ Power Distribution Products brochure, dated Aug. 2000.

* cited by examiner

MODULAR POWER DISTRIBUTION SYSTEM AND METHODS

CROSS-REFERENCE TO RELATED APPLICATIONS

This application is a continuation of application Ser. No. 12/490,911, filed Jun. 24, 2009, which is a continuation of application Ser. No. 11/654,367, filed Jan. 17, 2007, now U.S. Pat. No. 7,554,796, which claims the benefit of provisional application Ser. No. 60/760,598, filed Jan. 20, 2006 and provisional application Ser. No. 60/762,915, filed Jan. 27, 2006, which applications are hereby incorporated by reference in their entirety.

FIELD OF THE INVENTION

The present invention relates to a power distribution panel with circuit element modules.

BACKGROUND OF THE INVENTION

Electrical circuit panels such as power distribution panels typically include a number of different circuit elements such as fuse holders and fuses, circuit breakers, input and output connectors and alarm signal LED's. For safety and other reasons, the electrical circuits of power distribution panels are enclosed within a housing structure. Therefore, the circuit elements listed above have typically been inserted into holes that have been pre-cut or pre-punched into the housing structure, usually on a front or back panel of the housing structure.

These prior circuit panels are fixed and once the holes are formed in the housing, the type and arrangement of the components is limited. In order to manufacture different fixed circuit panels of the prior systems, a circuit panel manufacturer would punch out different patterns of holes in the front or back panels of the housing structure in order to accommodate different arrangements of circuit elements. Significant retooling time and costs are involved for offering different fixed panels. Assembly of the circuit elements is also difficult when the elements are inserted through holes. One solution is described and shown in U.S. Pat. No. 6,456,203.

In addition, such panels are hardwired between the input and output connections, and the fuse and/or breaker locations. In some panels, redundant power connections are provided, controlled by an OR-ing diode including a heat sink. These features can take up significant space within the panel.

There is a continued need for improved power distribution panels.

SUMMARY OF THE INVENTION

A modular power distribution system comprises a chassis; and a backplane including a power input, and a plurality of module connection locations. A plurality of modules are mounted in the chassis, each module mounted to one of the module connection locations. Each module includes: (i) an OR-ing diode; (ii) a circuit protection device; (iii) a microprocessor controlling the circuit protection device; and (iv) a power output connection location. A circuit option switch is located on each module for setting the current limits for each module. A system control module is provided connected to the backplane.

A modular power distribution system comprises a chassis having an open front and an interior; and a backplane positioned opposite to the open front, and including a power input, and a plurality of module connection locations. A plurality of modules are mounted in the interior of the chassis, each module mounted to one of the module connection locations. Each module includes: (i) a rear connector; (ii) a main body; (iii) a circuit protection device; (iv) a front panel; and (v) a power output connection location on the front panel.

DETAILED DESCRIPTION OF THE PREFERRED EMBODIMENTS

Figure 1:
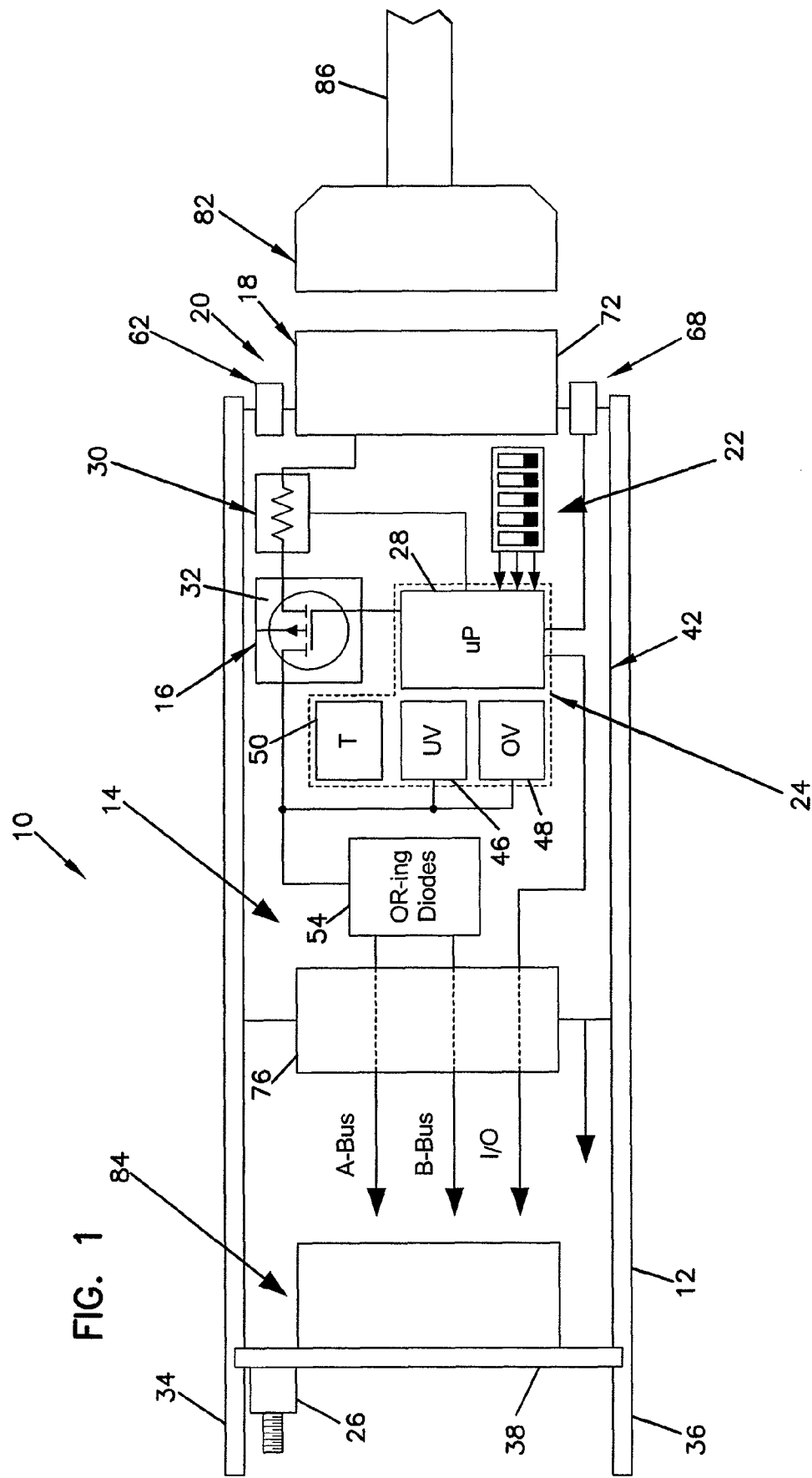
FIG. 1 is a schematic side view of one embodiment of a power distribution panel, with a module partially inserted into the chassis.
Figure 2:
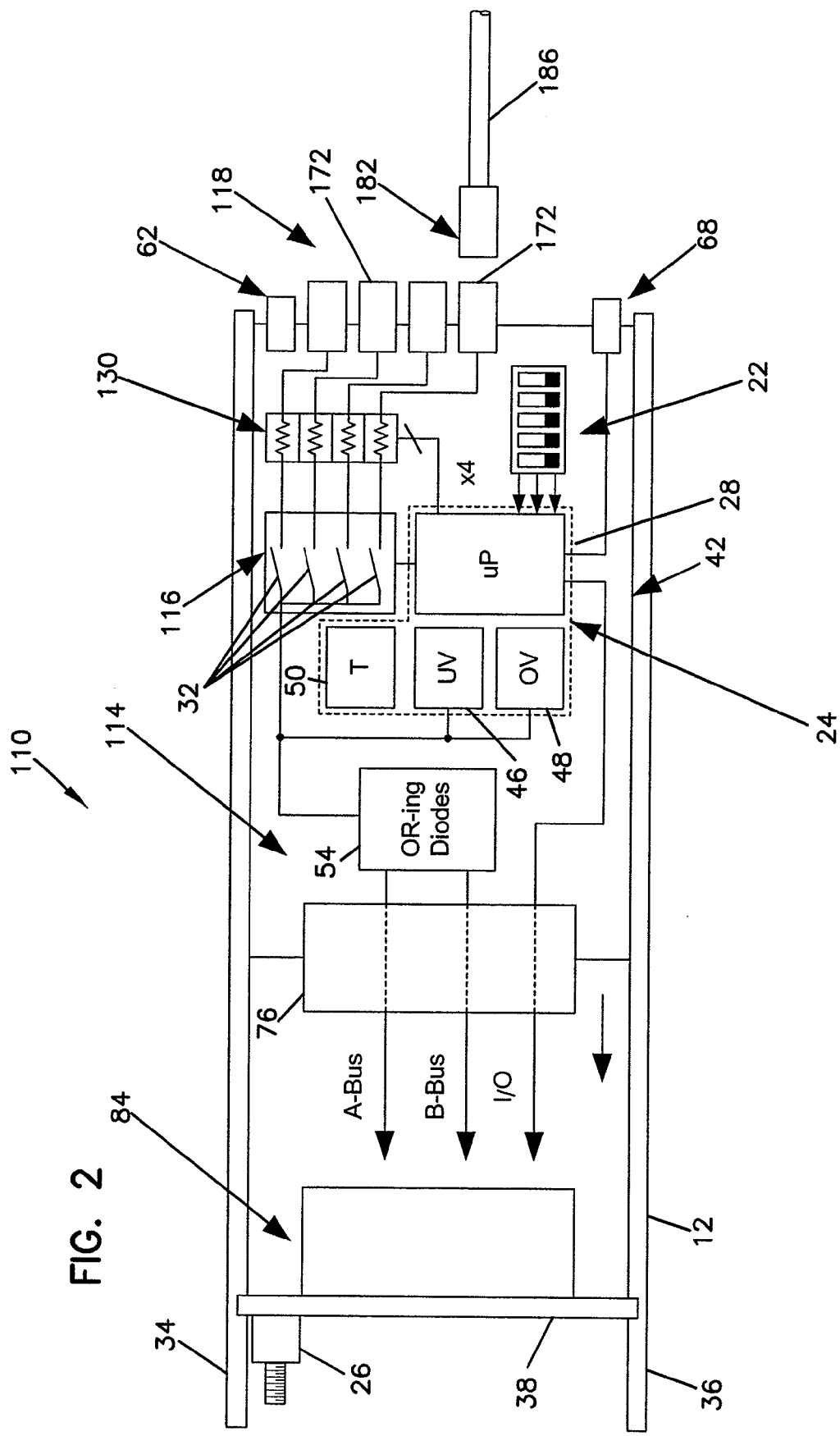
FIG. 2 is a schematic side view of another embodiment of a power distribution panel, with a module partially inserted into the chassis.

Referring to FIGS. 1 and 2, power distribution systems 10, 110 are shown. Power distribution systems 10, 110 are modular designs including a chassis 12 and removable circuit modules 14, 114. Each circuit module 14, 114 includes an electronic breaker 16, 116 for circuit protection, and a port assembly 18, 118 for output power distribution.

Chassis 12 includes a top 34 and a bottom 36. A backplane 38, such as a printed circuit board, provides the interconnection between modules 14, 114 and power input connector 26. Preferably, a second (redundant) power input connector 27 is provided (see FIG. 3).

Modules 14, 114 are received in chassis 12 through a front opening 20. Modules 14, 114 can be removed through front opening 20 as desired to repair, replace or service the modules. Modules 14, 114 can be latched or otherwise attached to chassis 12, as desired.

Modules 14, 114 are similar in many respects for distributing and monitoring the power in systems 10, 110. Modules 14, 114 each include a printed circuit board 42 with circuitry for linking the input power to the output power. Modules 14, 114 differ in the arrangements for the power outputs at port assemblies 18, 118. Module 10 includes a single power output connector 72, such as a high power connector including a DB9-2W2 connector; whereas module 110 includes a plurality of separate power output connectors 172, such as lower power connectors including screw terminals.

The electronic breakers 16, 116 are part of active circuit modules 14, 114 to replace discrete fuses and circuit breaker used in prior art power distribution panels. The end user adds, removes, or upgrades ports in the power distribution system as required by adding or removing circuit modules 14, 114.

Each circuit module 14, 114 can be used as a 1A, 2A, 10A, etc. breaker by setting current limit options switches 22. For example, 2 position DIP switches could be used. Prior art panels with discrete fuses and breakers have a single trip value. Control logic 24 including microcontroller 28 monitors the output current via current sensors 30, 130. If the output current exceeds the limits set by option switches 22, microcontroller 28 will turn-off ("trip") a breaker device 32, which is preferably a solid-state device. The current limit set by the option switches 22 can also be overridden via a software interface from a remote terminal through a control module 40 (see FIGS. 3 and 4). Microprocessor 28 is networked to an external processor through control module 40. If a breaker device 32 is tripped due to the detection of an over current condition, microcontroller 28 will periodically re-enable breaker device 32 to see if the fault still exists. This can eliminate a service visit if the over current was caused by a momentary transient condition.

Microcontroller 28 provides control over breaker device 32. This eliminates disconnects caused by source or load transients. Microcontroller 28 can also set a breaker trip point based on load monitoring over time. Microcontroller 28 is also equipped with a history file that records various conditions local to the individual circuit modules 14, 114. This information is accessible via the control module 40.

Microprocessor 28 can include a load dependent trip control algorithm. This option allows microprocessor 28 to set the breaker trip point for a given load based on a learning algorithm. Microprocessor 28 monitors outgoing current over time (can be a user selectable time period). Microprocessor 28 is configured to calculate a margin of error, then use the new value to create a trip value for each circuit module 14, 114. For example, one circuit module 14 is used in a 30 amp circuit. However, typically the circuit only draws a 27 amp load. Mircroprocessor 28 recognizes the 27 amp load by monitoring the current load over time, then adds a margin of error (e.g., 1%-5%) to create a load dependent trip value. Therefore, the circuit will trip before 30 amps is ever drawn. Such a system prevents over fusing, and damaged equipment.

Low voltage disconnect (LVD) is localized to the circuit modules 14, 114. Under voltage conditions are monitored by microcontroller 28 with an under voltage sensor 46. If the voltage drops below the recommended level, microcontroller 28 will turn breaker device 32 off to disconnect the load. The same process will occur if an over voltage condition occurs. Over voltage conditions are monitored by microcontroller 28 with an over voltage sensor 48.

To support redundant (dual feed) applications, the OR-ing diodes 54 are localized to the individual circuit modules 14, 114. Prior art power distribution panels that used OR-ing diodes placed them in the input circuits which required very large diodes and heat sinks and created a single point of failure for the system. The arrangement of systems 10, 110 allows the heat dissipated by the OR-ing diodes 54 to be evenly distributed in chassis 12 preventing a localized hot spot. The noted arrangement also reduces the size of the diodes and their respective heat sinks, and eliminates the single point of failure common in prior art power distribution panels. Circuit modules 14, 114 can also include a temperature sensor 50 for monitoring high temperature conditions.

An LED indicator 62 on each circuit module 14, 114 provides a visual status of input and output voltage, output current, temperature, over/under voltage conditions, and breaker trip. A local reset switch 68 is also provided to reset the breaker device 32 after a trip condition has occurred.

In circuit module 14, all input and output to the electronic breaker 16 is via a high current connector 18 to prevent accidental contact by service personnel. Circuit module 14 includes a front connector 72, and a rear connector 76. Front connector 72 connects to cable connector 82 and cable 86 for the output power. Rear connector 76 connects to chassis backplane connector 84 for input power to module 14. The high power connector also prevents polarity reversals.

Front connectors 172 of circuit module 114 each connect to a power output connector 182 and cable 186. Power output connector 182 may be a lug for screw connection to front connector 172.

Systems 10, 110 eliminate internal wiring normally required in prior art power distribution panels. All power and signaling is confined to PCB traces, planes, and bus bars, which improves reliability and reduces assembly cost. Chassis 12 is a passive component that can be reconfigured for a variety of applications. Systems 10, 110 also reduce the number of connections and thermal loss associated with each connection.

All circuit modules 14, 114 in chassis 12 communicate with control module 40. Control module 40 provides access to systems 10, 110 via a laptop serial or network connection for status and alarm information. Control module 40 also provides the external alarms signals common in Telco application. Access to control module 40 is through a front connector 56, or through a rear connector 58 on a back of backplane 38.

Figure 3:
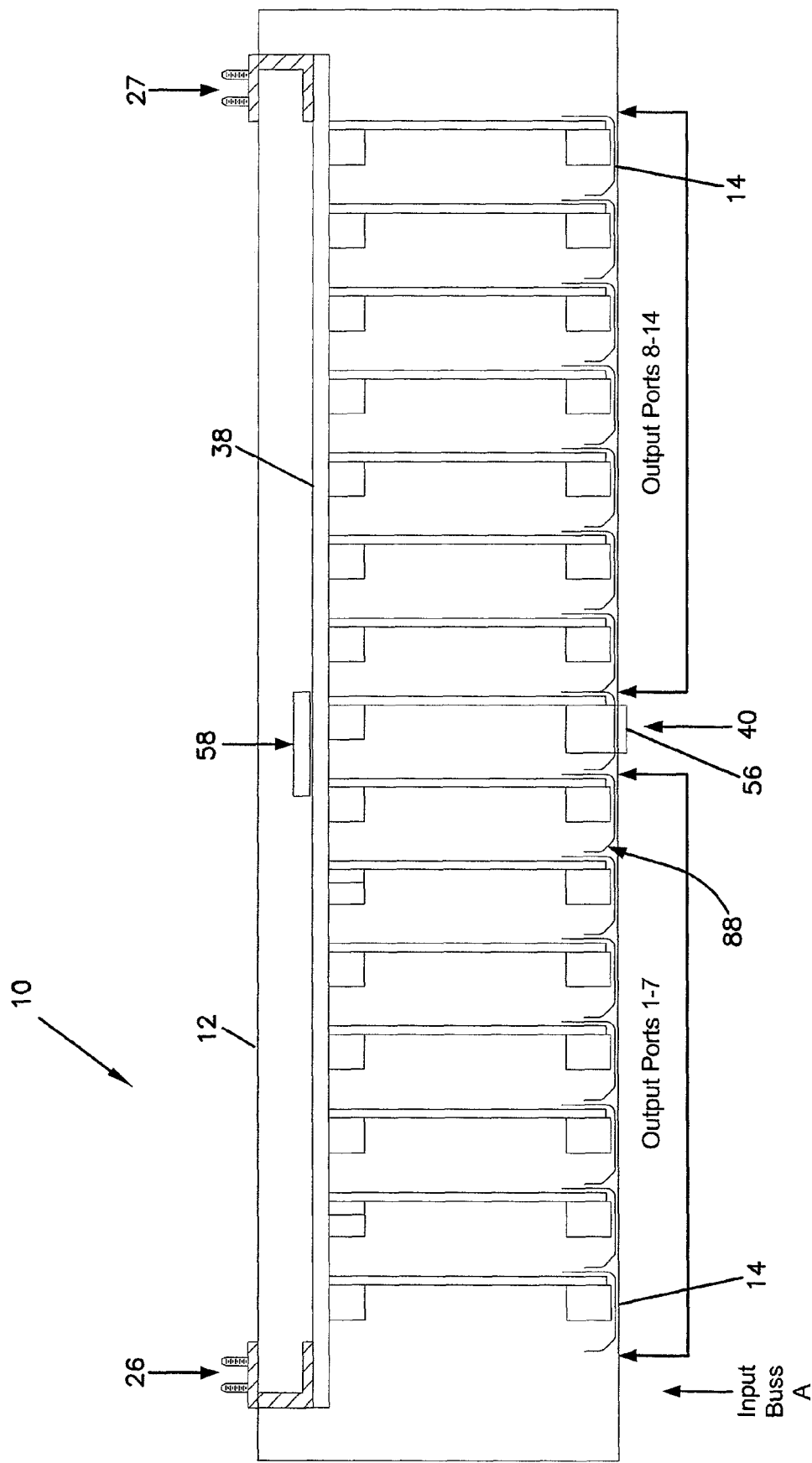
FIG. 3 is a schematic top view of the power distribution panel of FIG. 1.
Figure 4:
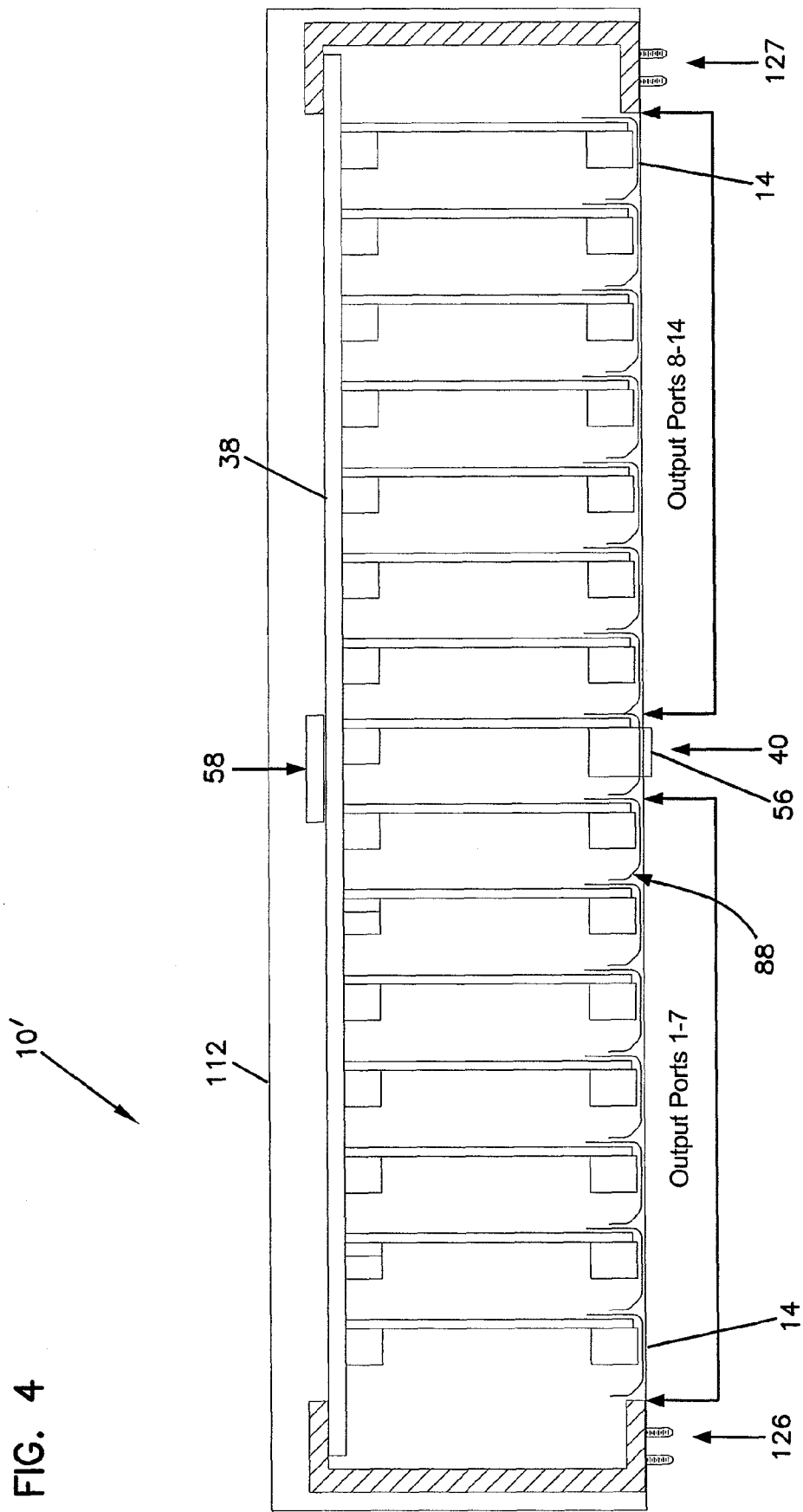
FIG. 4 is a schematic top view of an alternative embodiment of a power distribution panel.

Chassis 12 in FIG. 3 has rear input power connectors 26, 27, and front accessible circuit modules 14. A modified chassis 112 in system 10' as shown in FIG. 4 includes front accessible input power connectors 126, 127.

Circuit modules 14, 114 and control module 40 can be provided with front face plates 86 to protect the interior circuit features. Ventilation holes 88 can be added through front face plates 86, to allow for airflow through systems 10, 10', 110 for cooling of system components.

The above noted panels include modular arrangements for the individual or groupings of circuits. Additional modules can be added as additional circuits are added to the system. By utilizing localized OR-ing, smaller diodes and smaller heat sinks can be used. Additional advantages arise from the localized components associated with each module. In particular, with a localized low voltage disconnect elements, there is no need for a large low voltage disconnect contactors associated with a dedicated panel. Local LED indicators show indicators for each module allowing for improved diagnostics.

We claim:

1. A modular power distribution system comprising:
   (a) a chassis;
   (b) a backplane including:
      (i) a power input;
      (ii) a plurality of module connection locations;
   (c) a plurality of modules mounted in the chassis, each module mounted to one of the module connection locations, each module including:
      (i) an OR-ing diode;
      (ii) a circuit protection device;
      (iii) a microprocessor controlling the circuit protection device; and
      (iv) a power output connection location.

2. The modular power distribution system of claim 1, further comprising a circuit option switch located on each module.

3. The modular power distribution system of claim 1, further comprising a redundant power input connected to the backplane.

4. The modular power distribution system of claim 1, further comprising a control module mounted in the chassis.

5. The modular power distribution system of claim 1, wherein the circuit protection device includes a solid state breaker device.

6. The modular power distribution system of claim 1, wherein each module includes:
   (a) an over voltage sensor;
   (b) an under voltage sensor; and
   (c) a temperature sensor.

7. The modular power distribution system of chain 1, further comprising a load dependent trip control device.

8. A modular power distribution system comprising:
   (a) a chassis having an open front and an interior;
   (b) a backplane positioned opposite to the open front including:

(i) a power input;
(ii) a plurality of module connection location;
(c) a plurality of modules mounted in the interior of the chassis, each module mounted to one of the module connection locations, each module including:
(i) a rear connector for connecting to the backplane to receive input power from the power input;
(ii) a main body including a rear and a front, the rear connector located at the rear of the main body;
(iii) a circuit protection device on the main body connected to the rear connector;
(iv) a front panel located at the front of the main body;
(v) a power output connection location located on the front panel connected to the circuit protection device.

9. The modular power distribution system of claim 8, further comprising a microprocessor controlling the circuit protection device and a circuit option switch located on each module.

10. The modular power distribution system of claim 8, further comprising a redundant power input connected to the backplane.

11. The modular power distribution system of claim 8, further comprising a control module mounted in the chassis.

12. The modular power distribution system of claim 8, wherein the circuit protection device includes a solid state breaker device.

13. The modular power distribution system of claim 8, wherein each module includes:
(a) an over voltage sensor;
(b) an under voltage sensor; and
(c) a temperature sensor.

14. The modular power distribution system of claim 8, further comprising a load dependent trip control device.

15. The modular power distribution system of claim 8, wherein the power input is located on a rearward facing surface of the backplane.

16. The modular power distribution system of claim 8, wherein the power input includes a front accessible input power connector located adjacent to the open front.

17. A method for assembly of a power distribution system comprising:
(a) providing a chassis having an open front, and a rear backplane;
(b) selecting a plurality of modules;
(c) mounting each module to the chassis wherein:
(i) each module slides into an open front of the chassis;
(ii) each module connects to the backplane to provide each module with input power;
(iii) each module includes a circuit protection device;
(iv) each module provides output power along a front panel of each module, protected by the circuit protection device of each module.

* * * * *

UNITED STATES PATENT AND TRADEMARK OFFICE
CERTIFICATE OF CORRECTION

PATENT NO.        : 8,451,590 B2
APPLICATION NO.   : 13/193246
DATED             : May 28, 2013
INVENTOR(S)       : Coffey et al.

Page 1 of 1

It is certified that error appears in the above-identified patent and that said Letters Patent is hereby corrected as shown below:

In the Claims

Col. 5, line 2, claim 8: "connection location;" should read --connection locations;--

Signed and Sealed this
Fifth Day of November, 2013

Teresa Stanek Rea
*Deputy Director of the United States Patent and Trademark Office*